US011763260B2

(12) United States Patent
Holtz et al.

(10) Patent No.: US 11,763,260 B2
(45) Date of Patent: Sep. 19, 2023

(54) BRIDGING VARIOUS STANDARDS FOR DRILLING PROJECTS

(71) Applicant: Halliburton Energy Services, Inc., Houston, TX (US)

(72) Inventors: Stephen Robert Holtz, Katy, TX (US); Matthew Chase Holdeman, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 594 days.

(21) Appl. No.: 16/347,181

(22) PCT Filed: Jan. 12, 2017

(86) PCT No.: PCT/US2017/013163
§ 371 (c)(1),
(2) Date: May 2, 2019

(87) PCT Pub. No.: WO2018/132099
PCT Pub. Date: Jul. 19, 2018

(65) Prior Publication Data
US 2020/0265385 A1    Aug. 20, 2020

(51) Int. Cl.
*G06Q 10/10* (2023.01)
*G06Q 50/02* (2012.01)
(Continued)

(52) U.S. Cl.
CPC ........... *G06Q 10/103* (2013.01); *E21B 41/00* (2013.01); *G05B 19/4083* (2013.01);
(Continued)

(58) Field of Classification Search
CPC .... G06Q 30/018; G06Q 50/02; G06Q 10/103; G06Q 10/06313; E21B 41/00;
(Continued)

(56) References Cited

U.S. PATENT DOCUMENTS 7,898,403 B2    3/2011   Ritter et al.
2002/0169757 A1  11/2002  Bouzek et al.
(Continued)

FOREIGN PATENT DOCUMENTS

| CN | 104318408 | 1/2015 |
| KR | 20160082648 | 7/2016 |

OTHER PUBLICATIONS

Sadlier, Andreas , Laing, Moray , and John Shields. "Data Aggregation and Drilling Automation: Connecting the Interoperability Bridge between Acquisition, Monitoring, Evaluation, and Control." Paper presented at the IADC/SPE Drilling Conference and Exhibition, San Diego, California, USA, Mar. 2012 (Year: 2012).*

(Continued)

*Primary Examiner* — Carrie S Gilkey
(74) *Attorney, Agent, or Firm* — Barnes & Thornburg LLP

(57) ABSTRACT

Bridging different standards or requirements documents originating from different participants in a drilling project to unify the standards or requirements provides more efficiencies and cost savings for the drilling project. The standards or requirements may be automatically analyzed to determine which standards or requirements from the participants are to be utilized for a given drilling project to generate a common bridged document of requirements and standards thereby aiding to reduce costs and establish a common understanding of the requirements and standards that are to be met or implemented during the drilling project by all participants. The automatic process may select those standards or requirements, or portions thereof that are more stringent. Moreover, as an additional output of the automated process, output files may be produced that reflect those determined standards, requirements or parameters for subsequent use by standard (Continued)

engineering programs to generate technical parameters and requirements for the drilling project.

19 Claims, 8 Drawing Sheets

(51) Int. Cl.
- *G06F 40/30* (2020.01)
- *G06F 30/17* (2020.01)
- *E21B 41/00* (2006.01)
- *G05B 19/408* (2006.01)
- *G06Q 10/0631* (2023.01)

(52) U.S. Cl.
CPC .............. *G06F 30/17* (2020.01); *G06F 40/30* (2020.01); *G06Q 10/06313* (2013.01); *G06Q 50/02* (2013.01); *G05B 2219/45129* (2013.01)

(58) Field of Classification Search
CPC ...... G05B 19/4083; G05B 2219/45129; G06F 30/17; G06F 40/30
See application file for complete search history.

(56) References Cited

U.S. PATENT DOCUMENTS

| | | | |
|---|---|---|---|
| 2004/0153467 A1* | 8/2004 | Conover | G06F 16/38 |
| 2005/0050023 A1* | 3/2005 | Gosse | G06F 16/951 |
| 2006/0085452 A1 | 4/2006 | Cope | |
| 2013/0007577 A1 | 1/2013 | Hammoud | |
| 2014/0047310 A1 | 2/2014 | Potiagalov | |
| 2014/0297356 A1* | 10/2014 | Jayade | G06Q 30/018 705/317 |
| 2015/0220861 A1 | 8/2015 | Sanchez et al. | |
| 2016/0291575 A1 | 10/2016 | Moore et al. | |
| 2016/0292696 A1* | 10/2016 | Gong | H04L 63/101 |
| 2018/0266181 A1* | 9/2018 | Gawski | F03B 13/02 |

OTHER PUBLICATIONS

K.A. Macdonald, J.V. Bjune, Failure analysis of drillstrings, Engineering Failure Analysis, vol. 14, Issue 8, 2007, pp. 1641-1666, ISSN 1350-6307, https://doi.org/10.1016/j.engfailanal.2006.11.073 (https://www.sciencedirect.com/science/article/pii/S1350630706002251) (Year: 2007).*

L. Hsieh, "Industry preparing bridging document to facilitate safety case preparation for deepwater GOM", DrillingContractor.org, Sep. 8, 2016, http://www.drillingcontractor.org/industry-preparing-bridging-document-to-facilitate-safety-case-preparation-for-deepwater-gom-6976.

B. Straessle, "API Publishes new Bulletin on Well Constructon Interface", API, Dec. 4, 2013, https://www.api.org/news-policy-and-issues/news/2013/12/04/api-publishes-new-bulletin-on-well-const.

International Search Report and Written Opinion for corresponding application PCT/US2017/013163 dated Sep. 22, 2107, 12 pages.

D. Johnson, et al., "Bridging Documents: Current Legal Issues & Risk Mitigation", Sutherland Asbill & Brennan LLP, 2015, http://www.iadc.org/wp-content/uploads/2015/12/Risks-and-Issues-in-Bridging-Documents.pdf.

Preliminary French Search Report issued in corresponding FR Patent Application No. 1761744, dated Jan. 22, 2020.

Cesar K. Stradiotto, et al.; "Ontology Graphical Editor for Multilingual document Search System"; T. Andreasen et al. (Eds.): FQAS 2009, LNAI 5822, pp. 453-464, 2009.

\* cited by examiner

BRIDGING VARIOUS STANDARDS FOR DRILLING PROJECTS

The present disclosure relates generally to standardizing a process of creating bridging documents for drilling projects to create project specific design and operational parameters related to a drilling project, among other features.

BACKGROUND

The process to unify many different requirements and design specifications from among different parties engaged to participate in and accomplish a drilling project can often lead to time delays, different understanding of design and performance goals, requirements, cost constraints and other factors related to a drilling project. For example, a drilling project may require the participation of different companies such as a primary drilling service provider, multiple different sub-contractors and material providers, the companies may have differing understanding of drilling standards and possible acceptable variations, or which standards are even relevant. The process to reconcile and achieve agreement on standards and operational parameters among the participants of the drilling project can be a time consuming and costly process for achieving a successful drilling project, in accordance with a customer's project criteria.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1A:
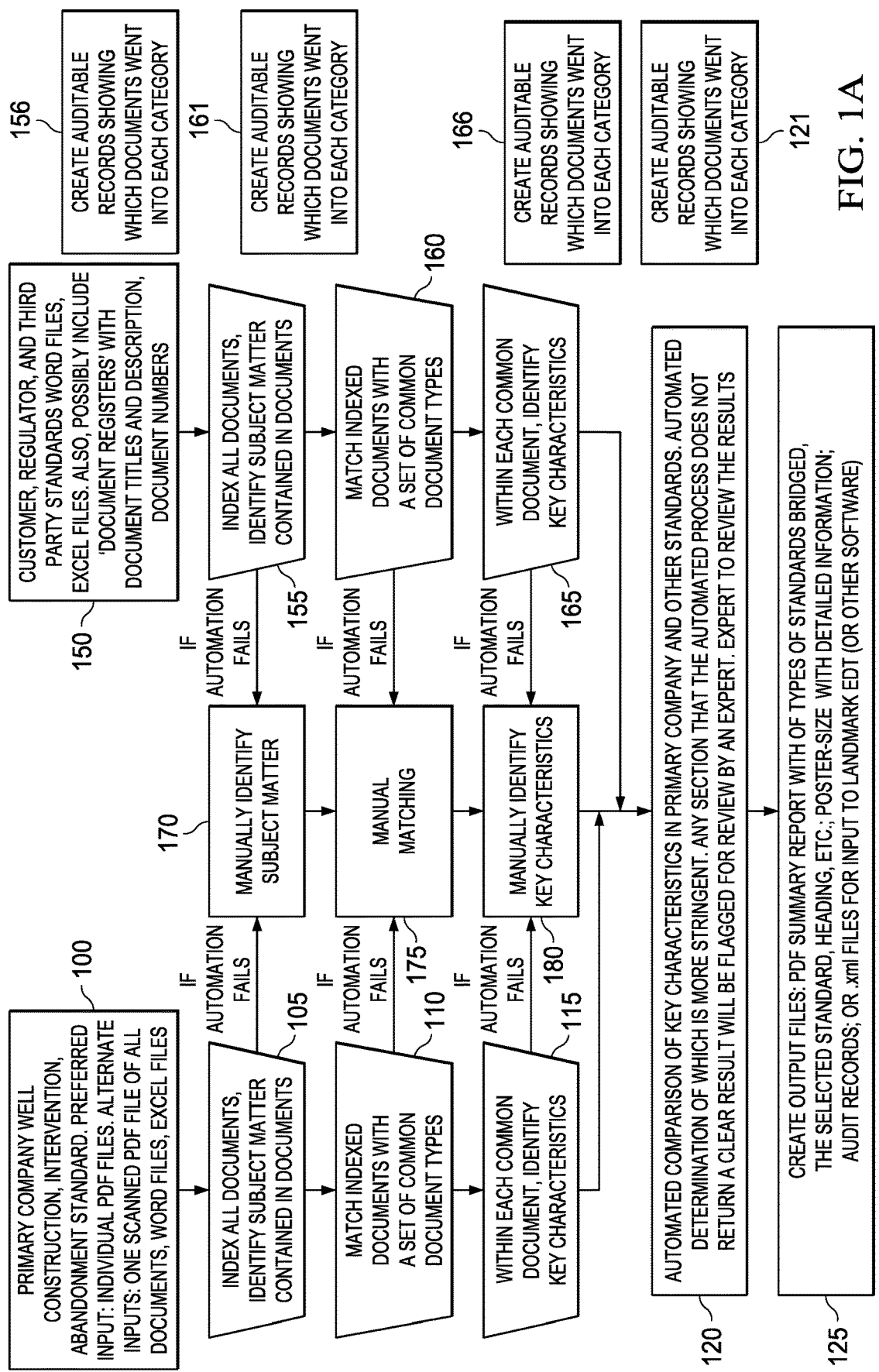
FIG. 1A is a flow diagram of an example overall process for bridging documents for a drilling project, the process performed according to principles of the disclosure.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

A "computer", as used in this disclosure, means any machine, device, circuit, component, or module, or any system of machines, devices, circuits, components, modules, or the like, which are capable of manipulating data according to one or more instructions, such as, for example, without limitation, a processor, a microprocessor, a central processing unit, a general purpose computer, a super computer, a personal computer, a laptop computer, a palmtop computer, a notebook computer, a desktop computer, a workstation computer, a server, or the like, or an array of processors, microprocessors, central processing units, general purpose computers, super computers, personal computers, laptop computers, palmtop computers, notebook computers, desktop computers, workstation computers, servers, or the like.

A "server", as used in this disclosure, means any combination of software and/or hardware, including at least one application and/or at least one computer to perform services for connected clients as part of a client-server architecture. The at least one server application may include, but is not limited to, for example, an application program that can accept connections to service requests from clients by sending back responses to the clients. The server may be configured to run the at least one application, often under heavy workloads, unattended, for extended periods of time with minimal human direction. The server may include a plurality of computers configured, with the at least one application being divided among the computers depending upon the workload. For example, under light loading, the at least one application can run on a single computer. However, under heavy loading, multiple computers may be required to run the at least one application. The server, or any if its computers, may also be used as a workstation.

A "database", as used in this disclosure, means any combination of software and/or hardware, including at least one application and/or at least one computer. The database may include a structured collection of records or data organized according to a database model, such as, for example, but not limited to at least one of a relational model, a hierarchical model, a network model or the like. The database may include a database management system application (DBMS) as is known in the art. The at least one application may include, but is not limited to, for example, an application program that can accept connections to service requests from clients by sending back responses to the clients. The database may be configured to run the at least one application, often under heavy workloads, unattended, for extended periods of time with minimal human direction.

A "communication link", as used in this disclosure, means a wired and/or wireless medium that conveys data or information between at least two points. The wired or wireless medium may include, for example, a metallic conductor link, a radio frequency (RF) communication link, an Infrared (IR) communication link, an optical communication link, or the like, without limitation. The RF communication link may include, for example, WiFi, WiMAX, IEEE 802.11, DECT, 0G, 1G, 2G, 3G or 4G cellular standards, Bluetooth, and the like.

The terms "including", "comprising" and variations thereof, as used in this disclosure, mean "including, but not limited to", unless expressly specified otherwise.

The terms "a", "an", and "the", as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

A "computer-readable medium", as used in this disclosure, means any medium that participates in providing data (for example, instructions) which may be read by a computer. Such a medium may take many forms, including non-volatile media and volatile media. Non-volatile media may include, for example, optical or magnetic disks and other persistent memory. Volatile media may include dynamic random access memory (DRAM). Transmission media may include coaxial cables, copper wire and fiber optics, including the wires that comprise a system bus coupled to the processor. Common forms of computer-readable medium include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other non-transitory medium from which a computer can read. A computer program product may be provided that stores software or computer readable program code on a computer-readable medium configured to, when read and executed by a processor, perform one or more steps of the processes described herein.

Various forms of computer readable media may be involved in carrying sequences of instructions to a computer. For example, sequences of instruction (i) may be delivered from a RAM to a processor, (ii) may be carried over a wireless transmission medium, and/or (iii) may be formatted according to numerous formats, standards or protocols, including, for example, WiFi, WiMAX, IEEE 802.11, DECT, 0G, 1G, 2G, 3G or 4G cellular standards, Bluetooth, or the like.

Different participants such as, e.g., a service company, a rig company, a regulator, an oil company or a primary contractor involved in a drilling project may utilize or understand different variations of design or operational criteria for drilling projects, and those differing variations can lead to, e.g., incompatibilities, cost variances, improper physical characteristics, or unnecessary delays to the project. Design or operational criteria are typically expressed in standards or requirements documents. Automating a process for reconciling differences in the standards or requirements documents, arising from or provided by the various participants can increase efficiencies, reduce overall costs and improve time frames of a drilling project. An example drilling project is illustrated in relation to FIG. 8, described more fully below.

Various standards or requirements documents associated with the primary contractor or participants and related to a drilling project may include, but not limited to:
i) Casing Design
  Minimum design factors
  Required load cases
  Minimum requirements for load cases
ii) Tubing Design
  Minimum design factors
  Required load cases
  Minimum requirements for load cases
iii) Directional Drilling
  Anti-collision certainty models
  Anti-collision close approach minimum distance requirements
  Dogleg severity maximum allowable, tortuosity maximum allowable
  Survey minimum spacing requirements
iv) Fluid Design
  Minimum overbalance requirements
  Pore pressure modeling requirements
  Fracture gradient modeling requirements
v) Well control
  Preferred methods for shut-in and kick circulation procedures
  Minimum requirements for kick tolerance calculations
  Minimum material stock requirements
vi) Rig Operation
  Maximum tripping speeds
  Requirements for swab and surge calculations which provide maximum speeds for tripping
  Pressure testing requirements FIG. 1A is a flow diagram of an example overall process for bridging documents for a drilling project, the process performed according to principles of the disclosure. The process is described in more detail in relation to the flow diagrams of FIGS. 2-6. The computer-implemented flow diagrams of FIGS. 1A-6 may equally represent a high-level block diagram of components of the disclosure implementing the steps thereof. The steps of FIGS. 1A-6, other than manual steps, may be implemented as computer program code 722 (FIG. 7) in combination with the appropriate computer hardware, e.g., computer 705. This computer program code 722 may be stored on storage media such as a diskette, hard disk, CD-ROM, DVD-ROM or tape, as well as a memory storage device 721 or collection of memory storage devices such as read-only memory (ROM) or random access memory (RAM). Additionally, the computer program code 722 can be transferred to a workstation over the Internet or some other type of network. Moreover, the computer code 722 may comprise a computer program product that is stored on a non-transitory computer readable medium and when read and executed by a computer processor executes the computer code.

The process of FIG. 1A may involve indexing standards or requirement documents from a primary service provider, and also standards documents from any one or more of: a customer, a regulator and one or more third-parties such as, e.g., a rig company, drilling partner, a service provider or a similar party. In one aspect, there may be parallel processes for the primary contractor company, and the other participants in the project. At step 100, the primary contractor provides documents as input to the process related to the drilling project which may include, but not limited to: a bid package, a tender document, well construction requirements, cost projections, standards, requirements, and similar documents. In a similar manner, at step 150, documents from each of the participants such as regulators, third party contractors, service providers and the like are provided as input to the process. Each participant may have drilling project related documents that specify parameters, standards or requirements that may not coincide completely with the parameters, standards or requirements with the primary contractor's documents, or with another participant. The drilling project related documents may be provided in individual .pdf format. Alternatively, the drilling project related documents may be provided in another format, such as, e.g., Word or Excel. The documents may also be formatted to include titles, section headings, description, document numbers or similar format elements.

At step 105, and similarly at step 155, the inputted documents may be indexed to identify and categorize subject matter contained in each document. If any subject matter cannot be identified, then at step 170 a manual identification by a user may occur. An auditable output record 156 may be produced that records which documents from which participant went into each category.

At step 110, and similarly step at 160, the indexed documents may be matched to a set of common drilling document types. Common drilling document types may include, but are not limited to, those listed in TABLE 1.

TABLE 1

| |
|---|
| Standard |
| Guideline |
| Regulation |
| Specification |
| Requirement |
| Design Requirement |
| Policy |
| Procedure |
| Guidance Document |
| Support Document |
| Manual |
| Instructions |
| Practice |
| Handbook |
| Reference Document |

If the matching cannot be accomplished automatically, a manual matching step 175 may occur. An auditable output record 161 may be produced that records which documents were matched and went into each category.

At step 115, and similarly step 165, within each common document type, key characteristics may be identified. If the identification of key characteristics cannot be achieved automatically, a manual identification step 180 may occur. An auditable output record 166 may be produced that records which key characteristics were identified in each document by category.

At step 120, an automatic comparison of key characteristics and standards and requirements in the various sections of primary contractor documents with the sections in the other participant's standards or requirements is made. The automatic determination determines which standards or requirements is more stringent. An auditable output record 121 may be produced that records which standards or requirements were identified as more stringent. If the automatic process cannot determine a clear result or there is ambiguity, then the relevant section may be marked for review by an expert. At step 125, a summary report may be created and provided that conveys which types of standards are bridged. The report may include one or more of: the standard, heading, key characteristics, the more stringent standard or requirement, detailed information related to the relevant parameters, audit records, and output files (e.g., xml files) for input to subsequent processing tools.

Figure 1B:
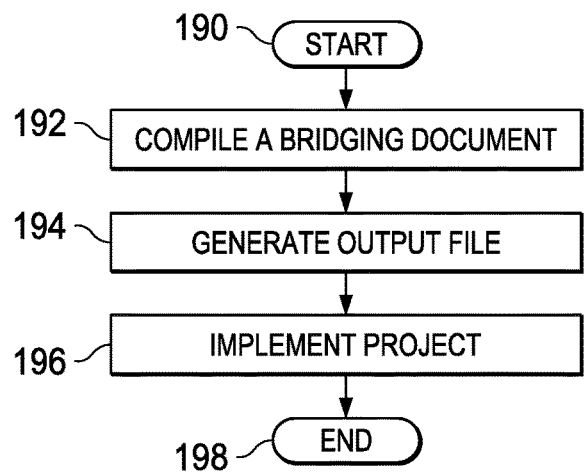
FIG. 1B is a flow diagram of an example generalized process for bridging documents for a drilling project, the process performed according to principles of the disclosure.

FIG. 1B is a flow diagram of an example generalized process for bridging documents for a drilling project, the process performed according to principles of the disclosure, starting mat step 190. The process of FIG. 1B may include one or more steps of FIGS. 1A and 2-6 for implementing the example project described in relation to FIGS. 8 and 9. The process of FIG. 1B may be implemented on the system described in relation to FIG. 7.

At step 192, a bridging standards document may be compiled by a computer comprising a plurality of determined more stringent standards documents, each determined more stringent standards document being related to a different one of a plurality of common drilling document types. Each of the plurality of determined more stringent standards documents may be determined as more stringent from among a plurality of standards documents where the plurality of standards documents may be different standards documents supplied by different participants of a common drilling project. The different standards documents supplied by the different participants of the common drilling project may include standards documents of different common drilling document types, describe more fully below. At step 194, an output file may be generated based on the bridging standards document for use by a subsequent design tool or drilling equipment for managing, specifying or controlling the drilling project, or controlling the drilling equipment.

Figure 2:
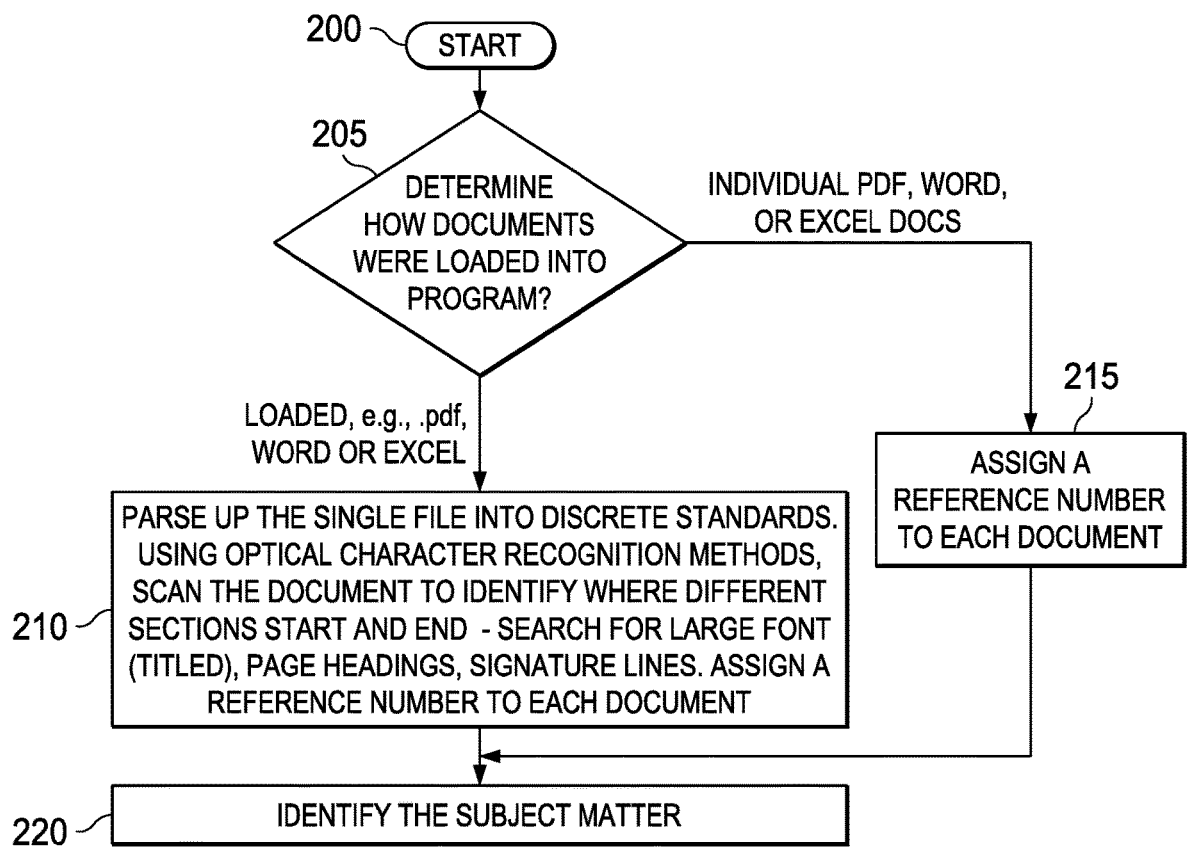
FIG. 2 is a flow diagram of an example process for indexing standards and to identify subject matter, the process performed according to principles of the disclosure.

FIG. 2 is a flow diagram of an example process for indexing standards and to identify subject matter, the process performed according to principles of the disclosure, starting at step 200. At step 205 a determination may be made as to how a document was loaded as input. If the document was loaded as one single file, e.g., as one .pdf, Word or Excel file, then at step 210, the single file may be parsed into discrete standards as a separate document. This may be accomplished using optical character recognition methods. The document may be scanned to identify where different sections start and end. This may involve searching for large font (e.g., title), page headings and signature lines. Each created discrete standard document may be assigned a reference number.

If, at step 205, a determination is made that individual .pdf, Word or Excel documents were loaded, then at step 215, a reference number may be assigned to each document.

At step 220, for each document having a reference number, the subject matter in each document is determined. This may be accomplished by searching key words and key phrases. For example, in a casing design document, common key words may include, e.g., casing, conductor casing, intermediate casing, production casing, liner, failure criteria (e.g., collapse, burst, tension, tri-axial), pressure testing, yield strength, corrosion, non-uniform material, connections, stress concentration, fatigue, abrasion, design control, design factors, and the like.

In contrast, a cementing standard might include key words such as, e.g., cementing, high pressure, high temperature, mud displacement, mud conditioning, cement slurry design, API cement, cementing equipment, cementing equipment selection, bump the plug, leak-off test, sock kick off plugs, shoe, shoe equipment, circulating temperature, cementing additives, blender, pump, batch mix, and the like.

Key words in standards may overlap. Several techniques may be used to determine the proper standard, these techniques may be used individually or in combination. Therefore, one technique to distinguish between standards with overlapping keywords may include counting the number of occurrences of a key word from a common standard type. The common standard type with the most key words is typically the correct standard type. Another technique may include assessing what fraction of the total number of key words are contained in a document. For example, if a document has 20 out of 100 (20%) of the key words from a casing key word list, but 80 out of 90 (88%) key words from the cementing key word list, then the document is more likely a cementing document. Yet another technique may be related to the title of the document, which may be identified by its position and font size in the document. Key words from the title may be given greater weighting factor in the overall calculation as to the determination of the type of document.

Figure 3:
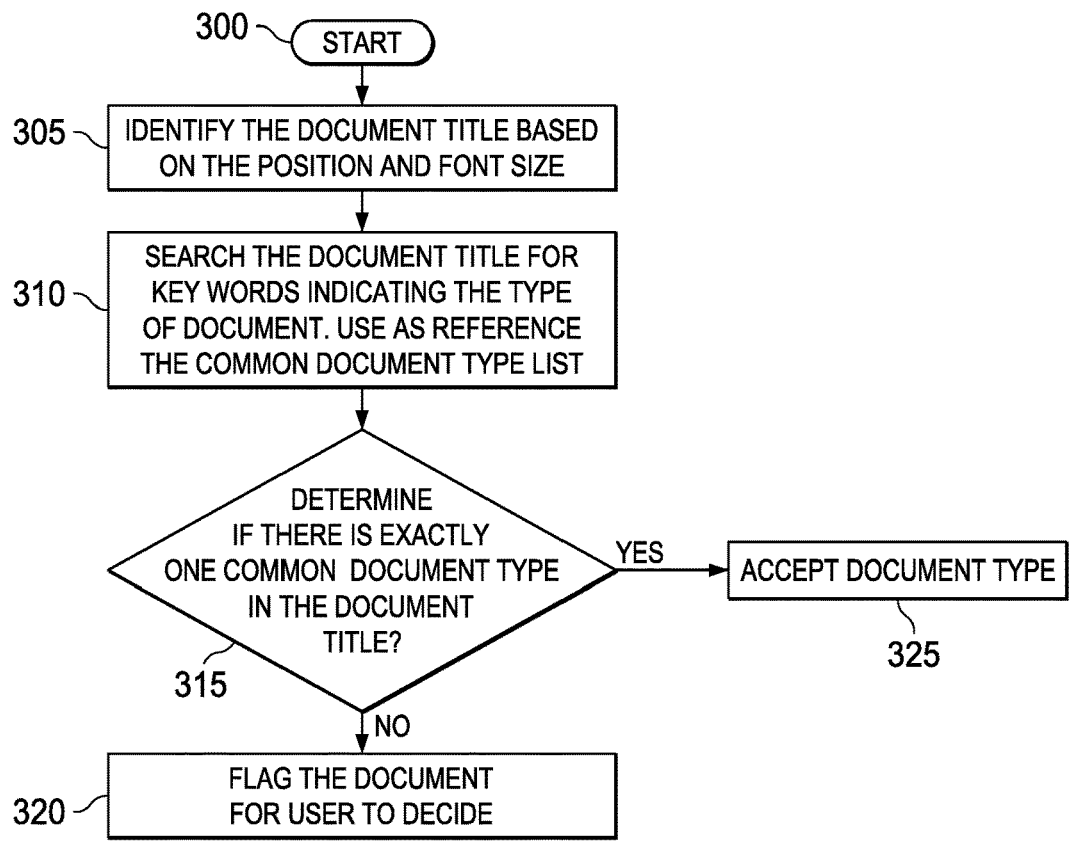
FIG. 3 is a flow diagram of an example process for identifying a document type, the process performed according to principles of the disclosure.

FIG. 3 is a flow diagram of an example process for identifying a document type, the process performed according to principles of the disclosure, starting at step 300. At step 305, the title of the document may be identified based on the position of font size within the document. At step 310, the title may be searched for key words indicating the type of document. This may be accomplished using a reference list of common document types. At step 315, a check may be made to determine whether or not exactly one common document type in the document title is present. If there is not, then at step 320, the document may be flagged for user intervention to manually decide a type of document. If there is exactly one common document type present in the document title, then at step 325, the determined document type may be accepted. Common document types may include those listed in TABLE 1.

Figure 4:
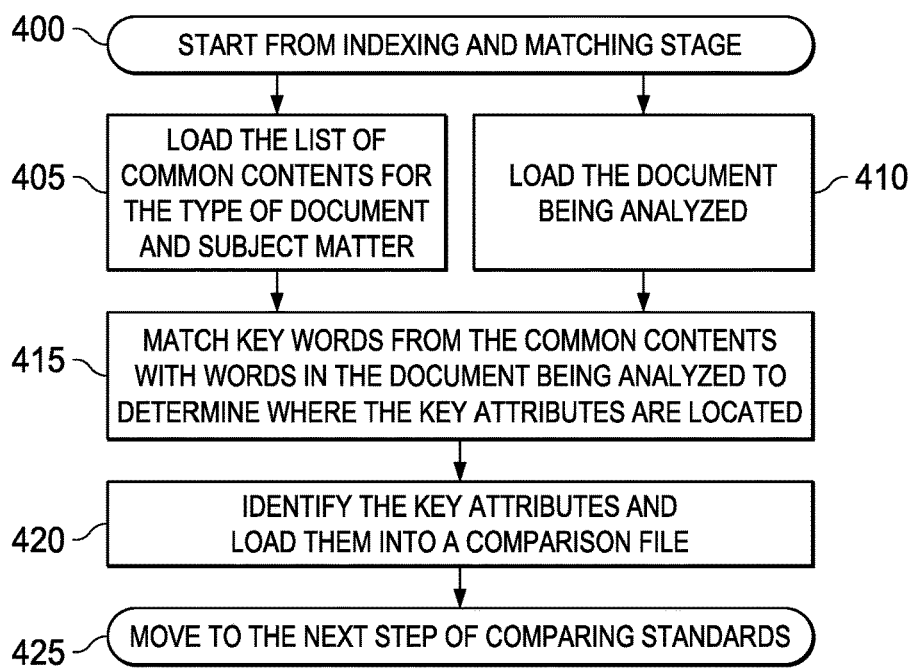
FIG. 4 is a flow diagram of an example process for indexing key characteristics, the process performed according to principles of the disclosure.

FIG. 4 is a flow diagram of an example process for indexing key characteristics, the process performed according to principles of the disclosure, starting at step 400. Common document types from different organizations or participants discuss similar subject matter and similar requirements. Once a standard or requirement document 711 has been identified as a certain type of document, the document 711 can be analyzed to identify key characteristics and requirements. For example, if a determination has been made that a document refers to casing design and is a standard common document type, then one or more of the following sections may be anticipated as being in the document:

i) Design policy
ii) Minimum load cases
iii) Casing design safety factors
iv) Gas gradient assumptions
v) Pressure testing standards
vi) Procurement standards
vii) Connections standards
viii) Casing wear standards
ix) Casing setting depth
x) Kick tolerance
xi) Temperature considerations (de-rating of yield strength)
xii) Corrosion design considerations (e.g., hydrogen sulfide, carbon dioxide, material selection, managing corrosion)
xiii) Special design cases
xiv) Cross-over design guidance (e.g., non-uniform material properties, connections, stress concentrations, fatigue, corrosion, abrasion, pre-use, design control)
xv) Design checklists Continuing with the process of FIG. 4, at step 405, a reference document 716 which may comprise a list of common contents for a determined type of document and subject matter may be accessed and loaded. At step 410, the standard or requirement document 711 being analyzed may be loaded. At step 415, the key words from the reference document 716 may be matched to words in the document being analyzed to determine where the key attributes are located. At step 420, the key attributes are identified which may be loaded into a comparison file 713 and associated with the particular standard or requirement document 711. More than one comparison file 713 may be created depending on the number of standard or requirements documents 711 provided by the participants. Examples of key attributes may include, e.g., numerical values of assumptions necessary to complete a design or to define an operational program. For a casing design standard, this may include, e.g., casing design factors, gas gradient assumptions, minimum load cases and kick tolerances. The process may continue with comparing and ranking of comparison files, as explained below.

Figure 5:
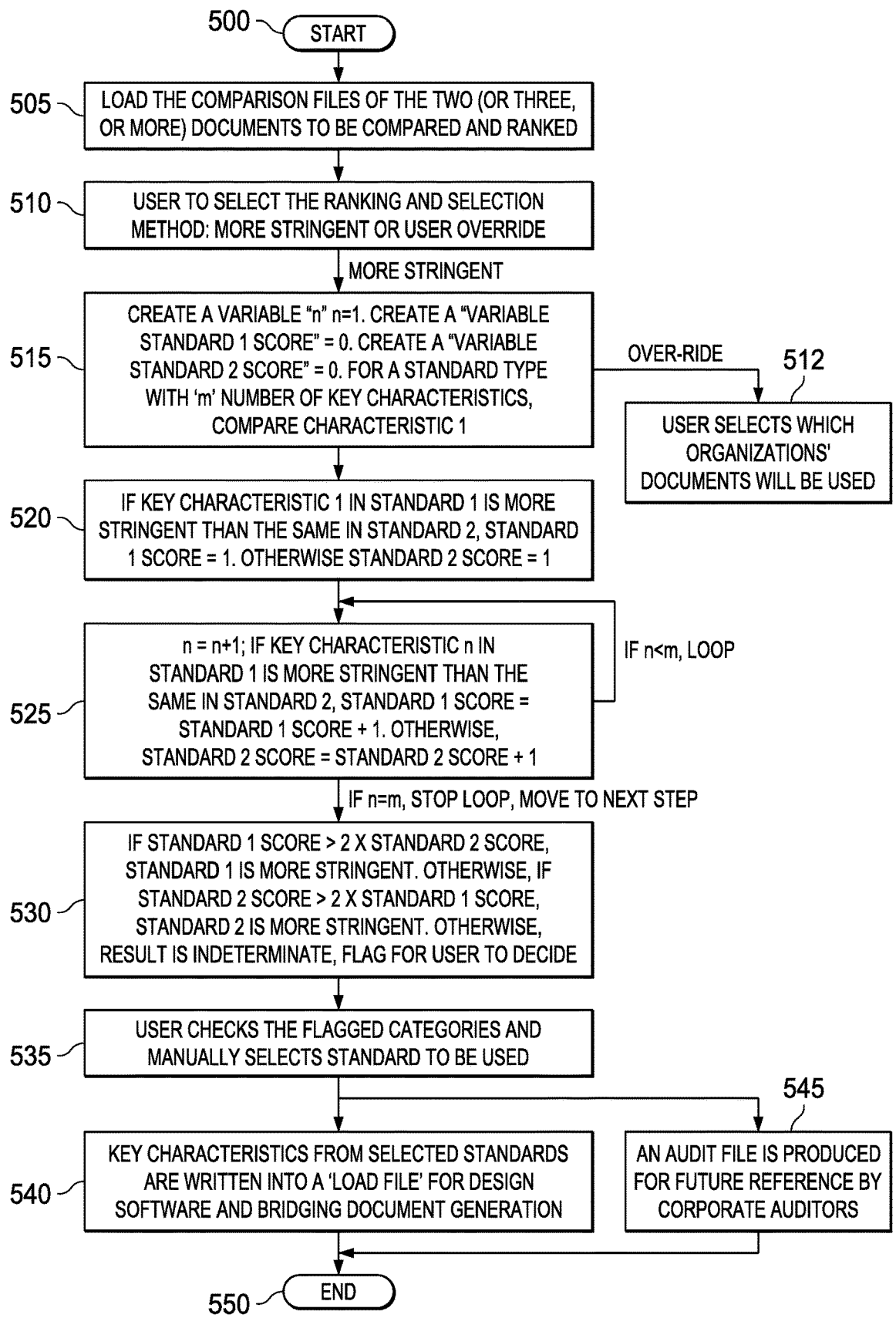
FIG. 5 is a flow diagram of an example process for comparing and ranking comparison files, the process performed according to principles of the disclosure.

FIG. 5 is a flow diagram of an example process for comparing and ranking comparison files, the process performed according to principles of the disclosure, starting at step 500. At step 505, two or more comparison files related to different organizations or participants may be loaded. Each comparison file may have been produced by the process of FIG. 4. This process shows comparison for two comparison files, but may be expanded to cover more than two comparison files to determine which comparison file is the most stringent. At step 510, a user may select the type of ranking and selection method, more stringent automatic determination method or a user override method. If a user override method is selected, at step 512 the user may select which comparison file and which organization or participant's documents are to be used.

If, however, at step 510, the user selects the automatic method, then at step 515, a score for each comparison file may be initialized, and a counter "n" may be initialized to 1. Each score may be maintained as a variable such as, e.g., "Standard 1 Score" and "Standard 2 Score." From "m" total characteristics to be compared, the first key characteristic representing the same key characteristic from each comparison file is compared. At step 520, if the key characteristic from the first standard is more stringent then the second standard, the "Standard 1 Score" is set to 1; otherwise "Standard 2 Score" is set to 1."

At step 525, the counter "n" may be incremented. If the key characteristic in Standard 1 comparison file is more stringent than the same standard in Standard 2 comparison file, then "Standard 1 Score is incremented; otherwise, Standard 2 Score is incremented. The "n" is less than "m", then processing continues with step 525 to compare the next key characteristic. If, however, "n"="m", then all key characteristics have been compared. Processing continues at step 530.

At step 530, if "Standard 1 Score">Weight×"Standard 2 Score", then Standard 1 is deemed more stringent; otherwise, if Standard 2 Score is >Weight×Standard 1 Score, Standard 2 is deemed more stringent. Weight may be a predetermined or programmable value that provides a weighting factor on how much one standard must exceed the other standard. By default m=2. If the resulting comparison is indeterminate, then a flag may be set for user intervention.

At step 535, if there is a flag, a user checks any indeterminate result and manually selects which standard is to be used. At step 545, an audit file 714 may be produced for future reference, such as by auditors. At step 540, the key characteristics from the selected standard(s), are written into one or more "load files" for design software utilization and bridging document generation, described more fully below.

Figure 6:
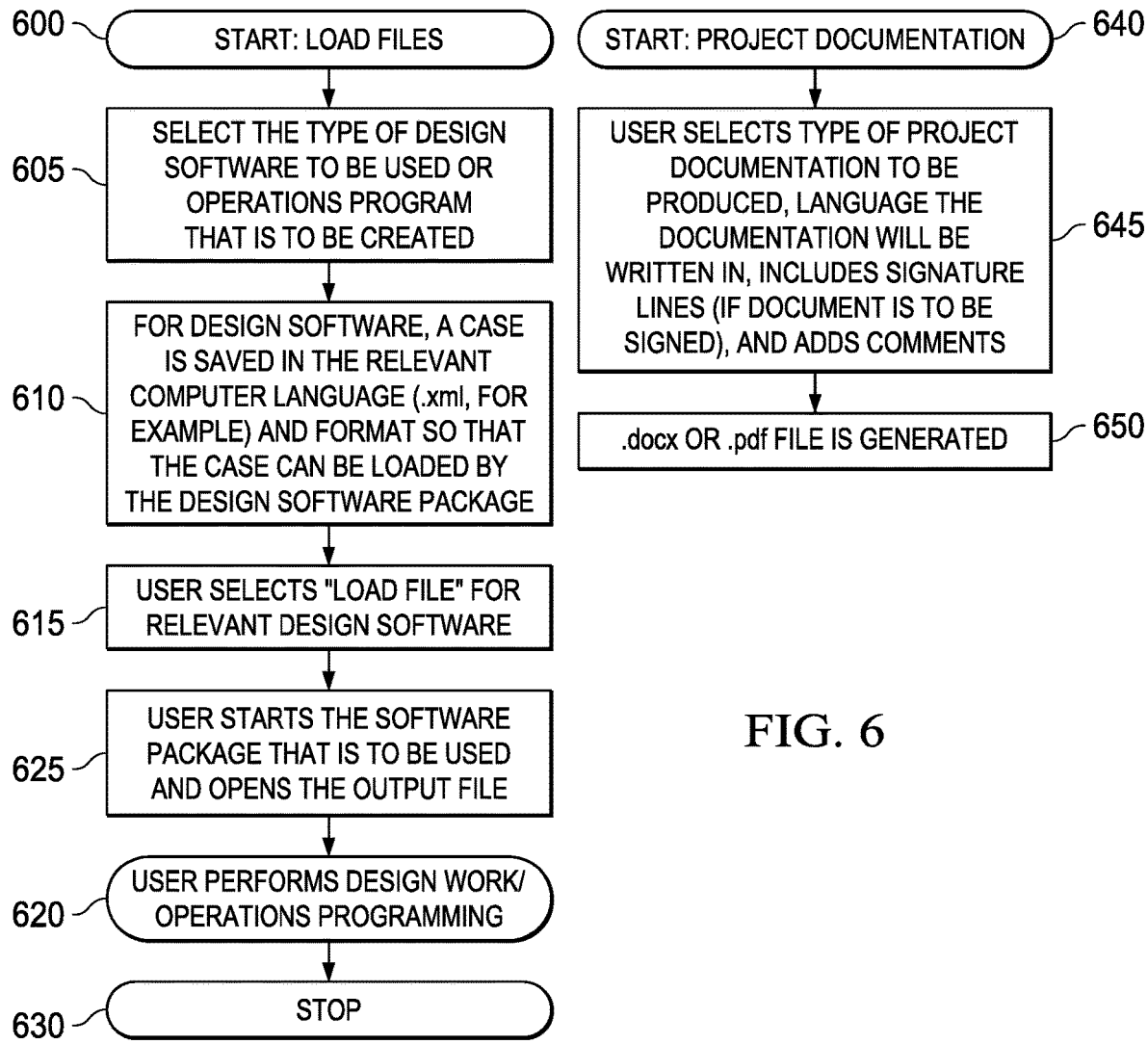
FIG. 6 is a flow diagram of an example process for comparing and ranking comparison files, the process performed according to principles of the disclosure.
Figure 7:
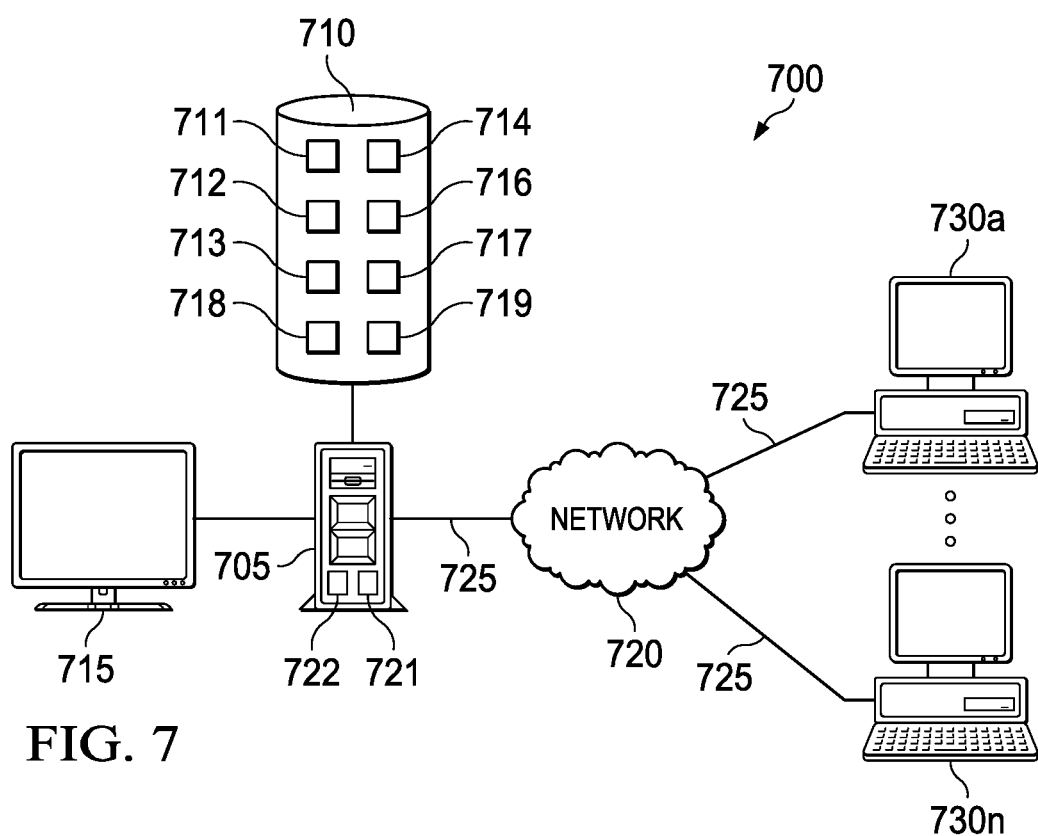
FIG. 7 is a block diagram of an example system 700, configured according to principles of the disclosure.

FIG. 6 is a flow diagram of an example process for comparing and ranking comparison files, the process performed according to principles of the disclosure, starting at step 600 where the output of the process of FIG. 5 may be loaded. At step 605, a user may select the type of software to be used or operations program that is to be created. The output of FIG. 5 may be scanned to find the information that is required for a specific type of output file to be generated. At step 610, one or more "load files" 717 may be produced depending on the type of software the user has selected in step 605. For a design software, a case may be saved in the relevant computer language, e.g., .xml, and format so that the case can be subsequently loaded by the design software package. For example, for a tubular design, the "load file" 717 may be a StressCheck file written in .xml code. StressCheck is a product of ESRD, Inc. This StressCheck output file may then be opened by the StressCheck software and a design started by a user with the constraints defined in the bridging document 712. The types of output files that can be produced by the process of FIG. 6 may include, but not limited to:

i) Project documentation—this may include an electronic or printed bridging document 712 that is a compilation of all the requirements and specifications that has been identified and selected by the process of FIG. 5. That is, a comprehensive document that "bridges" or compiles all the selected standards and requirements documents, or portions thereof, from the selection process of FIG. 5, and potentially including portions from documents associated with different participants associated with the drilling project. The bridged document 712 may be output and stored in a database such as database 710 (FIG. 7).

ii) Load files 717 for subsequent processing—this may include one or more files based on the bridging document for use by one or more traditional software programs, such as engineering programs, for drilling management, control, design, placement or operations. The software programs may include, e.g.:
Tubular stress analysis (input to Stresscheck program).
High-temperature-high pressure tubular analysis (input to WellCAT program).
Operation programs for manually operated rigs:
Well control procedures (pre-loaded into contingency plan).
Mud products minimum stock procedures (pre-loaded into mud program).
Tripping procedures (pre-loaded into bitrun parameters).
Drilling parameters (e.g., flow rate, rotary speed, weight on bit) (pre-loaded into bitrun parameters).
Downhole tool operations limits (pre-loaded into bitrun).
Connection procedures (pre-loaded into bitrun).
Operation programs for automated drilling rigs (to be loaded into the rig automation operating system or as well parameters):
Well control procedures.
Tripping procedures.
Drilling procedures.
Bit-trip economics.
Rig move procedures.
Rig commissioning procedures.
Pressure testing procedures.
Downhole tool operations limits.

iii) One or more output files 719 for control operations. This may be operational parameters 9 that may be loaded into a control system or equipment, examples of control systems and equipment include, but not limited to:
a) For an automated drilling rig (referring to FIG. 9):
Rig pump 62.
Drawworks 64.
Blow out preventer (BOP) 56.
Choke manifold 60.
Rotary equipment 54.
Pipe handling equipment 52.
b) For other well construction operations (referring to FIG. 9):
Cement pump 66.
Pressure-testing equipment 68—i.e. automated pressure testing of BOPs, high pressure lines.
Controlling logging equipment 70—tripping speeds, tight hole mitigation.
Controlling drawworks, pumps, rotary to minimize stuck pipe, monitor torque and drag by taking regular measurements.
c) Managing bulk materials on location.
Monitoring and ordering weighting agents and base fluids for drilling fluids to ensure minimum stock is maintained.
Monitoring and ordering bulk cement quantities to ensure minimum stock is maintained.

Continuing with the process of FIG. 6, at step 615, a user may select a "load file" 717 for the relevant design software. At step 625, the user may open the selected "load file" 717 as input and start the design software. At step 620, the user performs design work or operations programming. At step 630, the user may start project documentation. At step 635, the user may select the type of project documentation 718 to be produced, the language that the documentation will be written in and may include an optional signature line if the document is to be signed. At step 640, the project documentation 718 is generated and may include, e.g., a .docx or .pdf file. The project documentation may be printed or electronic and provided to participants of the drilling project. The project documentation 718 may subsequently be used to control, manage or implement an aspect of the drilling project.

FIG. 7 is a block diagram of an example system 700, configured according to principles of the disclosure. System 700 may be suitable for executing the processes of FIGS.

1-6. The system 700 may include a computer 705 having suitable memory 721 to execute computer program code 722. The computer 705 may comprise a server. The computer program code 722 may comprise the computer code for executing the processes of FIGS. 1-6. An input/output device 715 for use by a user may be coupled to the computer 705 for displaying output from, or conveying input to, the processes of FIGS. 1-6. A database 710 may be coupled to the computer 705 for storing various documents used by or produced by the processes of FIGS. 1-6. For example, the database 710 may store, and subsequently be accessed for reading, standards or requirements documents 711 which may be provided by various participants' computers 730a-730n in a drilling project, a bridging document 712, one or more comparison documents 713, one or more audit files 714 which may include records 121, 156, 161 and 166, one or more reference documents 716. The computer 705 may be coupled to a network 720 by a communication link 725 to the various participants' computers 730a-730n. Participants using participants' computers 730a-730n may provide the standards or requirement documents 711 related to the participants' drilling practices via the network 720, or other suitable manner, for processing by the processes of FIGS. 1-6.

Figure 8:
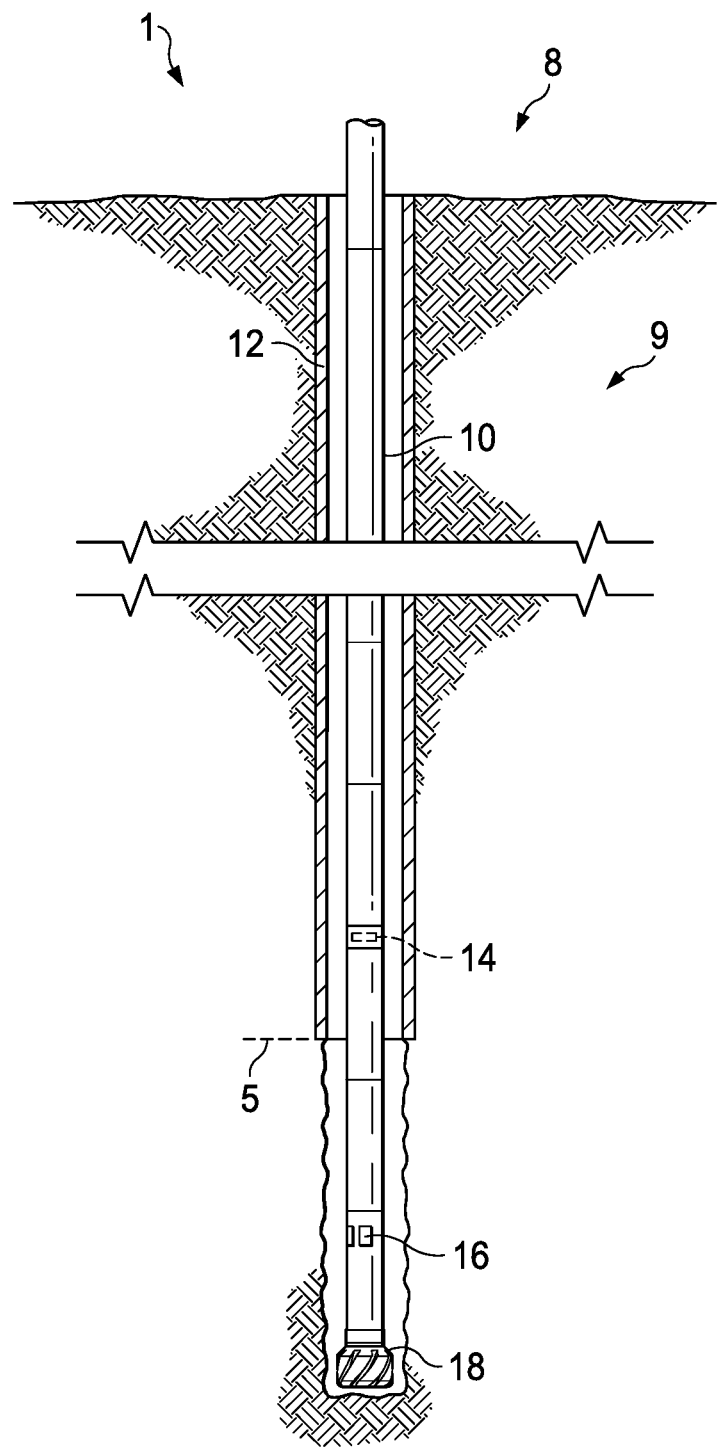
FIG. 8 is an illustration of an example drilling project, configured according to principles of the disclosure.

FIG. 8 is an illustration of an example drilling project, configured according to principles of the disclosure. Well 1 is meant to be illustrative and may be representative of any known variations including horizontal drilling or underwater drilling, and associated infrastructure.

The well 1 may be a subject of a drilling project for which a primary contractor and various other participants, e.g., a service company, a rig company, a regulator, an oil company, may join together to undertake. The standard or requirement documents 711 from different participants may relate to one or more aspects of the drilling project including any aspect associated with well 1 for which the produced bridging document 712 addresses and unifies. For example, the standards or requirements documents 711 may address, but not limited to: placement 8 of well 1, depth 5 of casing 1, string tubing 10, one or more downhole tools 14, drill bit 18, sensors 16, casing 12 wear standard and, generally, any parameter 9, requirement or standard related to the drilling project including any equipment associated with a rig, for placing and producing well 1. The one or more downhole tools 14 may comprise, e.g., a logging-while-drilling tool, a communications tool, pressure testing equipment, or similar tools.

Figure 9:
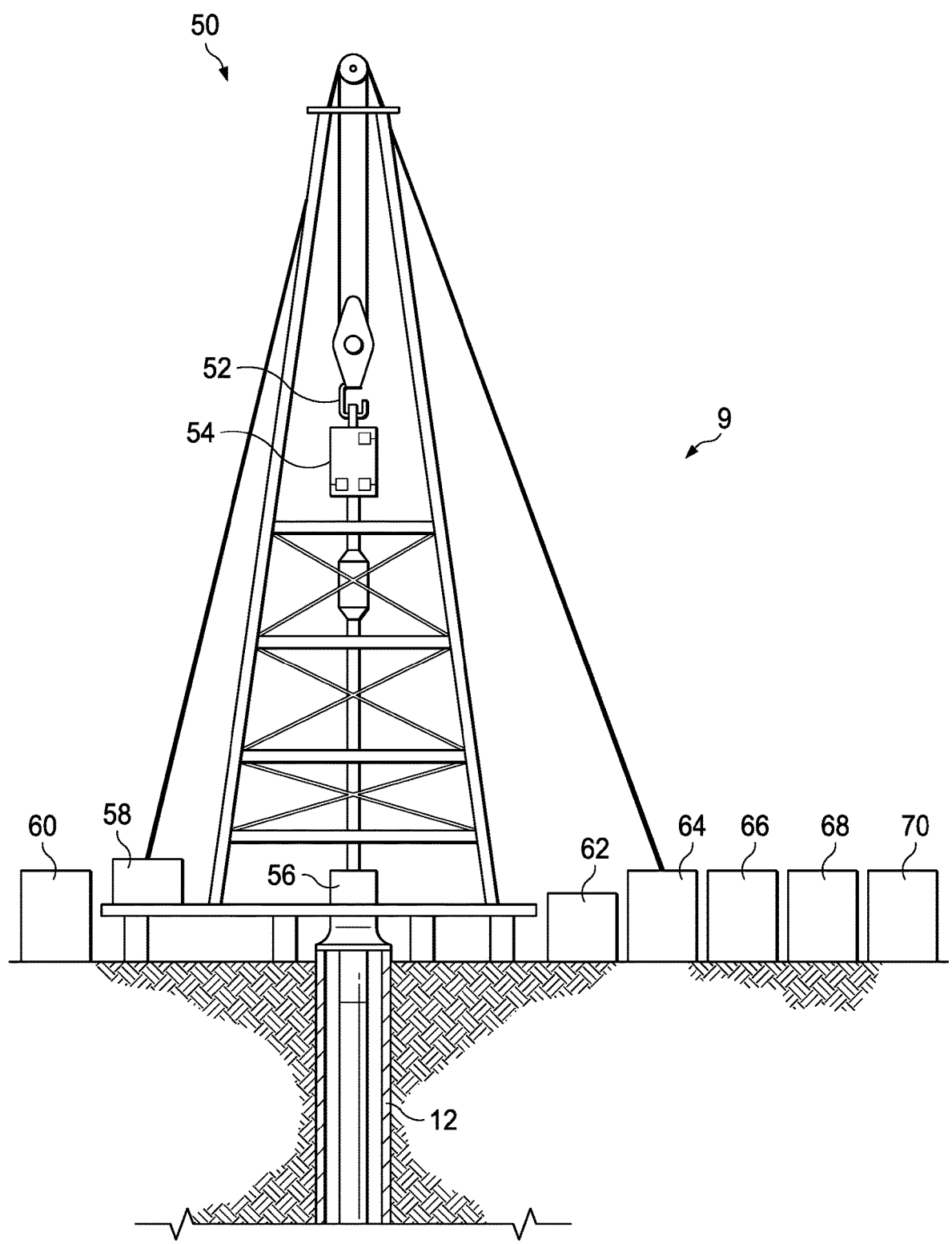
FIG. 9 is an illustration of an example drilling rig and associated equipment, configured according to principles of the disclosure.

FIG. 9 is an illustration of an example drilling rig 50 and associated equipment, configured according to principles of the disclosure. The drilling rig may be used as part of the drilling project shown in FIG. 8. The example drilling rig 50 may include one or more of: pipe handling equipment 52, rotary equipment 54, a blow-out preventer 56, torque and drag monitoring equipment 58, a choke manifold 60, a rig pump, a drawworks 64, a cement pump 66, pressure equipment 68 or logging equipment 70. The one or more output files 719 may include operational parameters 9 that may be loaded into and control operations of one or more of the equipment of FIG. 9.

The various aspects of the disclosure may include the following:

Clause 1: A computer-implemented method for bridging standards for drilling projects comprising:

compiling by a computer a bridging standards document comprising a plurality of determined more stringent standards documents, each determined more stringent standards document being related to a different one of a plurality of common drilling document types, each of the plurality of determined more stringent standards documents being determined as more stringent from among a plurality of standards documents, the plurality of standards documents being different standards documents supplied by different participants of a common drilling project; and generating by the computer an output file based on the bridging standards document for use by a subsequent design tool or drilling equipment for managing, specifying or controlling the drilling project or the drilling equipment.

Clause 2. The computer-implemented method of clause 1, wherein the different standards documents supplied by the different participants of the common drilling project include standards documents of different common drilling document types.

Clause 3. The computer-implemented method of clause 2, wherein the common drilling document types include:
 a standard document;
 a guideline document;
 a regulation document;
 a specification document;
 a requirement document;
 a design requirement document;
 a policy document;
 a procedure document;
 a guidance document;
 a support document;
 a manual document;
 an instructions document;
 a practice document;
 a handbook document; and
 a reference document.

Clause 4. The computer-implemented method of clause 1, wherein each of the determined more stringent standards documents is determined more stringent by comparing key characteristics of one of the plurality of standards documents with at least one other of the plurality of standards documents for a same common drilling document type.

Clause 5. The computer-implemented method of clauses 1, 2 or 3, wherein each of the determined more stringent standards documents is determined by separately counting the number of key characteristics in each of the plurality of standards documents for a same common drilling document type to provide a separate total count of key characteristics for each of the plurality of standards documents, with the highest resulting count plus a weighting factor identifying the determined more stringent standards document for the same common drilling document type.

Clause 6. The computer-implemented method of clause 5, wherein the key characteristics found in a title in the plurality of standards documents is given more weight.

Clause 7. The computer-implemented method of clause 5, wherein the output file comprises operational parameters to control the drilling equipment including one or more of:
 a) drawworks;
 b) a rig pump;
 c) a blow out preventer;
 d) a choke manifold;
 e) a rotary equipment;
 g) pipe handling equipment;
 h) a cement pump;
 i) pressure-testing equipment;
 j) logging equipment;
 k) torque and drag monitoring equipment.

Clause 8. A computer program product comprising a non-transitory computer readable medium having computer readable program code embodied therein said computer readable program code adapted to be executed by a computer that causes execution of the following:

compiling a bridging standards document comprising a plurality of determined more stringent standards documents, each determined more stringent standards document being related to a different one of a plurality of common drilling document types, each of the plurality of determined more stringent standards documents being determined as more stringent from among a plurality of standards documents, the plurality of standards documents being different standards documents supplied by different participants of a common drilling project; and generating an output file based on the bridging standards document for use by a subsequent design tool or drilling equipment for managing, specifying or controlling the drilling project or the drilling equipment.

Clause 9. The computer program product of clause 8, wherein the different standards documents supplied by the different participants of the common drilling project include standards documents of different common drilling document types.

Clause 10. The computer program product of clause 9, wherein the common drilling document types include:
a standard document;
a guideline document;
a regulation document;
a specification document;
a requirement document;
a design requirement document;
a policy document;
a procedure document;
a guidance document;
a support document;
a manual document;
an instructions document;
a practice document;
a handbook document; and
a reference document.

Clause 11. The computer program product of clause 8, wherein each of the determined more stringent standards documents is determined more stringent by comparing key characteristics of one of the plurality of standards documents with at least one other of the plurality of standards documents for a same common drilling document type.

Clause 12. The computer program product of clauses 8, 9 or 10 wherein each of the determined more stringent standards documents is determined by separately counting the number of key characteristics in each of the plurality of standards documents for a same common drilling document type to provide a separate total count of key characteristics for each of the plurality of standards documents, with the highest resulting count plus a weighting factor identifying the determined more stringent standards document for the same common drilling document type.

Clause 13. The computer program product of clause 12, wherein the key characteristics found in a title in the plurality of standards documents is given more weight.

Clause 14. The computer program product of clause 8, wherein the different standards documents supplied by the different participants of the common drilling project include standards documents of different common drilling document types.

Clause 15. The computer program product of clause 8, wherein the output file comprises operational parameters to control equipment related to the drilling project.

Clause 16. A computer-implemented method for bridging standards for drilling projects, comprising:

indexing by a computer a plurality of different standards documents associated with a common drilling project to categorize subject matter contained in each different standards document to produce a plurality of indexed standards documents;

matching by the computer each of the plurality of indexed standards documents to a common drilling document type to identify a type of standard for each indexed standards document;

identifying by the computer key characteristics within each indexed standards document based on the identified type of standard;

determining by the computer which key characteristics are more stringent between a first indexed standards document and at least one other indexed standards document for selecting the more stringent standards document; and producing by the computer a bridged standards document that identifies the determined key characteristics and at least one associated selected more stringent standards document, and producing an output file for use by a subsequent design tool for managing, specifying or controlling the drilling project or the output file comprise operational parameters to control equipment related to the drilling project.

Clause 17. The computer-implemented method of clause 16, wherein in the step of matching, the common drilling document type includes one of:
a standard document;
a guideline document;
a regulation document;
a specification document;
a requirement document;
a design requirement document;
a policy document;
a procedure document;
a guidance document;
a support document;
a manual document;
an instructions document;
a practice document;
a handbook document; and
a reference document.

Clause 18. The computer-implemented method of clauses 16 or 17, wherein the indexing the plurality of different standards documents indexes the plurality of different standards documents that are provided by a plurality of participants associated with the common drilling project.

Clause 19. The computer-implemented method of clause 18, wherein the plurality of participants include a plurality of: a service company, a rig company, a regulator, an oil company and a primary contractor.

Clause 20. The computer-implemented method of any one of clauses 16-19, wherein the indexing includes searching for a title based on key words or phrases to categorize the subject matter.

Clause 21. The computer-implemented method of any one of clauses 16-20, wherein the identifying key characteristics within each indexed standards document based on the identified type of standard includes producing a comparison file for each indexed standards document that contains the identified the key characteristics, including a first comparison file and at least one other comparison file.

Clause 22. The computer-implemented method of clause 21, wherein the determining which key characteristics are more stringent between a first indexed standards document and at least one other indexed standards document includes comparing a key characteristic of the first comparison file to the same key characteristic of the at least one other comparison file and scoring the first comparison file and a scoring the at least one other comparison file.

Clause 23. The computer-implemented method of clause 22, wherein at least one other indexed standards document comprises a plurality of other indexed standards documents and the step of producing a bridged standards document includes producing a bridged standards document comprising a plurality of standards documents determined by the scoring.

Clause 24. The computer-implemented method of any one of clauses 16-23, wherein the output file is written in a relevant computer language for use as input by the subsequent design tool for managing, specifying or controlling the drilling project.

Clause 25. The computer-implemented method of clause 16, wherein the at least one other indexed standards document comprises a plurality of other indexed standards documents.

Clause 26. The computer-implemented method of clause 16, wherein the plurality of different standards documents comprise at least one requirements document.

Clause 27. The computer-implemented method of clause 16, wherein the operational parameters includes operational parameters to control one or more of:
a) drawworks;
b) a rig pump;
c) a blow out preventer;
d) a choke manifold;
e) a rotary equipment;
g) pipe handling equipment;
h) a cement pump;
i) pressure-testing equipment;
j) logging equipment; and
k) torque and drag monitoring equipment.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

What is claimed is:

1. A computer-implemented method for bridging standards for drilling projects, comprising:
compiling, reconciling and unifying by a computer a bridging standards document for agreement of different participants of a common drilling project, the bridging standards document comprising a plurality of determined more stringent standards documents, each determined more stringent standards document being related to a different one of a plurality of common drilling document types, each of the plurality of determined more stringent standards documents being determined as more stringent from among a plurality of standards documents, by a user selected ranking and scoring method, the plurality of standards documents being different standards documents supplied by the different participants of a common drilling project; wherein each of the determined more stringent standards documents is determined by identifying and locating a plurality of key characteristics in each of the plurality of standards documents and separately counting the number of key characteristics in each of the plurality of standards documents for a same common drilling document type to provide a separate total count of key characteristics for each of the plurality of standards documents, with the highest resulting count plus a weighting factor identifying the determined more stringent standards document for the same common drilling document type; wherein the plurality of standards documents address at least one of placement of a well, depth of a casing, string tubing, a downhole tool, a drill bit, a sensor, a casing, or a wear standard;
generating by the computer an output file based on the reconciled and unified bridging standards document;
loading the output file into a control system of an automated drilling rig; and
controlling the operational parameters of the automated drilling rig according to the output file; wherein the controlled operational parameters correspond to at least one of a rig pump, pipe handling equipment, a drawworks, a blow out preventer, a choke manifold, a rotary equipment, a cement pump, a pressure-testing equipment, a logging equipment, or a torque and drag monitoring equipment.

2. The computer-implemented method of claim 1, wherein the different standards documents supplied by the different participants of the common drilling project include standards documents of different common drilling document types.

3. The computer-implemented method of claim 2, wherein the common drilling document types include:
a standard document;
a guideline document;
a regulation document;
a specification document;
a requirement document;
a design requirement document;
a policy document;
a procedure document;
a guidance document;
a support document;
a manual document;
an instructions document;
a practice document;
a handbook document; and
a reference document.

4. The computer-implemented method of claim 1, wherein each of the determined more stringent standards documents is determined more stringent by comparing key characteristics of one of the plurality of standards documents with at least one other of the plurality of standards documents for a same common drilling document type.

5. The computer-implemented method of claim 1, wherein the key characteristics found in a title in the plurality of standards documents is given more weight.

6. The computer-implemented method of claim 1, wherein the output file is written in a relevant computer language for use as input by the subsequent design tool for managing, specifying or controlling the drilling project.

7. A computer program product comprising a non-transitory computer readable medium having computer readable program code embodied therein said computer readable program code adapted to be executed by a computer that causes execution of the following:
compiling, reconciling and unifying a bridging standards document for agreement of different participants of a common drilling project, the bridging standards document comprising a plurality of determined more stringent standards documents, each determined more stringent standards document being related to a different one of a plurality of common drilling document types, each of the plurality of determined more stringent standards documents being determined as more stringent from among a plurality of standards documents, by a user selected ranking and scoring method, the plurality of standards documents being different standards documents supplied by the different participants of a common drilling project; wherein each of the determined more stringent standards documents is determined by identifying and locating a plurality of key characteristics in each of the plurality of standards documents and separately counting the number of key characteristics in each of the plurality of standards documents for a same common drilling document type to provide a separate total count of key characteristics for each of the plurality of standards documents, with the highest resulting count plus a weighting factor identifying the determined more stringent standards document for the same common drilling document type; wherein the plurality of standards documents address at least one of placement of a well, depth of a casing, string tubing, a downhole tool, a drill bit, a sensor, a casing, or a wear standard;

generating an output file based on the reconciled and unified bridging standards document;

loading the output file into a control system of an automated drilling rig; and controlling the operational parameters of the automated drilling rig according to the output file; wherein the controlled operational parameters correspond to at least one of a rig pump, pipe handling equipment, a drawworks, a blow out preventer, a choke manifold, a rotary equipment, a cement pump, a pressure-testing equipment, a logging equipment, or a torque and drag monitoring equipment.

8. The computer program product of claim 7, wherein the key characteristics found in a title in the plurality of standards documents is given more weight.

9. The computer program product of claim 7, wherein the output file is written in a relevant computer language for use as input by the subsequent design tool for managing, specifying or controlling the drilling project.

10. A computer-implemented method for bridging standards for drilling projects, comprising:

indexing, reconciling and unifying by a computer a plurality of different standards documents for agreement of different participants of a common drilling project, the bridging standards document associated with the common drilling project to categorize subject matter contained in each different standards document to produce a plurality of indexed standards documents;

matching by the computer each of the plurality of indexed standards documents to a common drilling document type to identify a type of standard for each indexed standards document;

identifying by the computer key characteristics within each indexed standards document based on the identified type of standard;

determining by the computer and by a user selected ranking and scoring method which key characteristics are more stringent between a first indexed standards document and at least one other indexed standards document for selecting the more stringent standards document; wherein the more stringent standards document is determined by identifying and locating a plurality of key characteristics in each of the plurality of standards documents and separately counting the number of key characteristics in the first indexed standards document and at least one other indexed standards document for a same common drilling document type to provide a separate total count of key characteristics for each of the indexed standards documents, with the highest resulting count plus a weighting factor identifying the determined more stringent standards document for the same common drilling document type; wherein the plurality of standards documents address at least one of placement of a well, depth of a casing, string tubing, a downhole tool, a drill bit, a sensor, a casing, or a wear standard;

producing by the computer a reconciled and unified bridged standards document that identifies the determined key characteristics and at least one associated selected more stringent standards document, and producing an output file based on the reconciled and unified bridging standards document;

loading the output file into a control system of an automated drilling rig; and controlling the operational parameters of the automated drilling rig according to the output file; wherein the controlled operational parameters correspond to at least one of a rig pump, pipe handling equipment, a drawworks, a blow out preventer, a choke manifold, a rotary equipment, a cement pump, a pressure-testing equipment, a logging equipment, or a torque and drag monitoring equipment.

11. The computer-implemented method of claim 10, wherein in the step of matching, the common drilling document type includes one of:
a standard document;
a guideline document;
a regulation document;
a specification document;
a requirement document;
a design requirement document;
a policy document;
a procedure document;
a guidance document;
a support document;
a manual document;
an instructions document;
a practice document;
a handbook document; and
a reference document.

12. The computer-implemented method of claim 10, wherein the indexing the plurality of different standards documents indexes the plurality of different standards documents that are provided by a plurality of participants associated with the common drilling project.

13. The computer-implemented method of claim 12, wherein the plurality of participants include at least two participants of any type selected from: a service company, a rig company, a regulator, an oil company and a primary contractor.

14. The computer-implemented method of claim 10, wherein the indexing includes categorizing the subject matter using key words within the title.

15. The computer-implemented method of claim 10, wherein the identifying key characteristics within each indexed standards document based on the identified type of standard includes producing a comparison file for each indexed standards document that contains the identified the key characteristics, including a first comparison file and at least one other comparison file.

16. The computer-implemented method of claim 15, wherein the determining which key characteristics are more stringent between a first indexed standards document and at least one other indexed standards document includes comparing a key characteristic of the first comparison file to the same key characteristic of the at least one other comparison file and scoring the first comparison file and a scoring the at least one other comparison file.

17. The computer-implemented method of claim 16, wherein at least one other indexed standards document comprises a plurality of other indexed standards documents and the step of producing a bridged standards document includes producing a bridged standards document comprising a plurality of standards documents determined by the scoring.

18. The computer-implemented method of claim 10, wherein the output file is written in a relevant computer language for use as input by the subsequent design tool for managing, specifying or controlling the drilling project.

19. The computer-implemented method of claim 10, wherein the at least one other indexed standards document comprises a plurality of other indexed standards documents.

\* \* \* \* \*